US009528179B2

(12) United States Patent
Fabry et al.

(10) Patent No.: US 9,528,179 B2
(45) Date of Patent: Dec. 27, 2016

(54) TREATMENT OF STEEL SURFACES

(71) Applicant: Wacker Chemie AG, Munich (DE)

(72) Inventors: Laszlo Fabry, Burghausen (DE); Barbara Mueller, Burgkirchen (DE); Michael Stepp, Ueberackern (AT)

(73) Assignee: Wacker Chemie AG, Munich (DE)

( * ) Notice: Subject to any disclaimer, the term of this patent is extended or adjusted under 35 U.S.C. 154(b) by 239 days.

(21) Appl. No.: 14/355,923

(22) PCT Filed: Oct. 17, 2012

(86) PCT No.: PCT/EP2012/070543
§ 371 (c)(1),
(2) Date: May 2, 2014

(87) PCT Pub. No.: WO2013/064372
PCT Pub. Date: May 10, 2013

(65) Prior Publication Data
US 2014/0295081 A1    Oct. 2, 2014

(30) Foreign Application Priority Data

Nov. 2, 2011    (DE) .................. 10 2011 085 574

(51) Int. Cl.
| C23C 22/00 | (2006.01) |
| C23C 14/12 | (2006.01) |
| C23C 22/02 | (2006.01) |
| C09D 183/04 | (2006.01) |
| C09D 183/08 | (2006.01) |
| C23C 16/24 | (2006.01) |
| C08G 77/26 | (2006.01) |
| C23G 1/08 | (2006.01) |

(52) U.S. Cl.
CPC ............ C23C 14/12 (2013.01); C09D 183/04 (2013.01); C09D 183/08 (2013.01); C23C 16/24 (2013.01); C23C 22/02 (2013.01); C08G 77/26 (2013.01); C23C 2222/20 (2013.01); C23G 1/085 (2013.01); Y10T 428/31663 (2015.04)

(58) Field of Classification Search
USPC .............. 428/446, 447; 427/249.15, 255.11, 427/255.18, 331
See application file for complete search history.

(56) References Cited

U.S. PATENT DOCUMENTS

| 2,985,677 | A | 5/1961 | Gainer |
| 3,085,908 | A | 4/1963 | Morehouse et al. |
| 5,101,565 | A | 4/1992 | Trankiem |
| 6,132,808 | A | 10/2000 | Brown et al. |
| 7,708,970 | B2 | 5/2010 | Hesse et al. |
| 2003/0101898 | A1 | 6/2003 | Standke et al. |
| 2003/0157391 | A1* | 8/2003 | Coleman ............. C23C 22/02 429/465 |
| 2006/0088666 | A1 | 4/2006 | Kobrin et al. |
| 2006/0204767 | A1* | 9/2006 | Albert et al. ......... B05D 7/584 428/447 |
| 2008/0312356 | A1 | 12/2008 | Kobrin et al. |
| 2009/0036618 | A1 | 2/2009 | Geisberger et al. |
| 2009/0264612 | A1 | 10/2009 | Stanjek et al. |
| 2010/0209719 | A1 | 8/2010 | Borup et al. |

FOREIGN PATENT DOCUMENTS

| CN | 1343237 | | 4/2002 |
| CN | 101815757 | A | 8/2010 |
| DE | 3920297 | A1 | 1/1991 |
| EP | 1308428 | A2 | 5/2003 |
| EP | 1850413 | A1 | 10/2007 |
| JP | 06-505410 | | 6/1994 |
| JP | 0790288 | A | 4/1995 |
| JP | 0810703 | A | 1/1996 |
| JP | 2008-523177 | A | 7/2008 |
| JP | 2009-35736 | A | 2/2009 |
| WO | 90/15852 | | 12/1990 |
| WO | 92/15431 | A1 | 9/1992 |
| WO | 2007030532 | A2 | 3/2007 |

OTHER PUBLICATIONS

Chinese Office Action CN Patent Appln. No. 201280053435.1; Dated May 4, 2015; 7 pages (No English Translation).
Xiao, Ji-Mei (J,M, Shaw), Shen, Hus-Sheng (H.S. Shen), "The Theoretical Aspects of the Problem of Preventing a Corrosion of Stainless Steel Used as Structural Material for the Production of Polycrystalline Silicon" Rare Metals, (Beijing University of Iron and Steel Technology) (General Research Institute of Non-Ferrous Metals, Ministry of Metallurgical Industry) vol. 1, No. 2, Received Oct. 5, 1981 Revised Apr. 3, 1982.
Mui, Jeffrey P., "Corrosion mechanism of Metals and Alloys in the Silicon-Hydrogen-Chlorosilane System at 500 C*" (National Association of Corrosion Engineers) vol. 41, No. 2, p. 63-69, Feb. 1985.
Bhadha, Paul M., Green, Everett R., Hercules Incorporated, Wilmington, Deleware "Joule-Thomson Expansion and Corrosion in HCI Systems" (Solid State Technology) Jul. 1992.
Breneman, W.C. Union Carbide Chemicals and Plastics, Sistersville, WV, "Direct Synthesis of Chlorosilanes and Saline" (Studies of Organic Chemistry 49 "Catalyzed Direct Reaction of Silicon") 1993 Elsevier Science Publishers B. V., Netherlands.
Viefhaus H., Richarz B., "Phosphorus in Iron and Steal—An Overview of Analytical Investigations of the Segregation Behavior of Phosphorus on Internal and External Iron and Steel Surfaces" (Materials and Corosion 46, 306-316) (1995) VCH Verlagsgesellschaft mbH, D69451 Wenheim, 1995.
W. Noll: Chemie and Technologie der Silicone, Verlag Chemie, Weinheim 1968, p. 201.

* cited by examiner

Primary Examiner — Archene Turner
(74) Attorney, Agent, or Firm — Brooks Kushman P.C.

(57) ABSTRACT

The content of phosphorus in polycrystalline silicon prepared by the Siemens process is reduced by treating phosphorus-containing steel surfaces with an α-amino-functional alkoxysilane. The treated surface exhibits less corrosion in an atmosphere of moist hydrogen chloride, and less loss of phosphorus as a result.

6 Claims, No Drawings

TREATMENT OF STEEL SURFACES

CROSS-REFERENCE TO RELATED APPLICATIONS

This application is the U.S. National Phase of PCT Appln. No. PCT/EP2012/070543 filed Oct. 17, 2012, which claims priority to German Application No. 10 2011 085 574.2 filed Nov. 2, 2011, the disclosures of which are incorporated in their entirety by reference herein.

BACKGROUND OF THE INVENTION

1. Field of the Invention

The invention relates to a process for treating a steel surface.

2. Description of the Related Art

Such a treatment is intended to bring about passivation of the corrosion-susceptible surfaces of steel containers, chemical reactors, pipes, distillation columns, steel supports, etc. In particular, the invention relates to the passivation of surfaces in chemical plants or plant components which come into contact simultaneously with residual moisture, chlorine, hydrogen chloride [P. M. Bhadha, E. R. Greece: Joule-Thomson Expansion and Corrosion in HCl Systems in Solid State Technology July 1992 pp. 3-7], chlorosilanes, hydrogen and reactive elemental silicon.

It is known that residual moisture in gases and/or stainless steel plants causes corrosion in the presence of hydrogen chloride [J. Y. P. Mui: Corrosion Mechanism of Metals and Alloys in the Silicon-Hydrogen-Chlorosilane System at 500 C in Corrosion—NACE, 41(2), 1985 pp. 63-69; W. C. Breneman: Direct Synthesis of Chlorosilanes and Silane in Catalyzed Direct Reactions of Silicon, Elsevier 1993 pp. 441-457, in particular table 3 on p. 454].

A natural corrosion protection on the surface of carbon steel or of stainless steel can be formed at above 500° C. in the reductive atmosphere of a chlorosilane-hydrogen chloride-hydrogen mixture. This also applies to SiC-coated carbon steel.

In stainless steel containers, the steel is usually tested for chloride stress cracking corrosion.

Hydrogen chloride chlorinates phosphorus-containing constituents of the steel alloy [H. Viefhaus, B. Richarz: Phosphor in Eisen and Stahl in Materials and Corrosion, 46, 1995 pp. 306-316], as a result of which phosphorus chlorides are formed and these either contaminate, as volatile contamination, the silane stream or can react with silanes or boron compounds to form undefined adducts which cannot be separated from the products in the purification of chlorosilanes by distillation [Xiao Ji-mei, Shen Hua-sheng: The Theoretical Aspects of Preventing Corrosion of Stainless Steel . . . in the Production of Polycrystalline Silicon in Xiyou-jinshu—Rare Metals, Chin. Vol 1-2, 1982 pp. 3-15, in particular equation (44) and pp. 13-15].

In the reductive hydrogen atmosphere of a deposition of polycrystalline silicon (Siemens process U.S. Pat. No. 7,708,970 B2; chlorosilane and hydrogen as starting materials), phosphorus chlorides are reduced and phosphorus is preferentially incorporated into the deposited polycrystalline silicon.

Passivation of the steel surface can slow or prevent both the moisture and the reductive corrosion.

It is known from JP7090288 A2 and U.S. Pat. No. 2,985,677 A that silicon-organic halogen compounds are chemisorptively bound as silyl esters to active Fe—OH sites on steel surfaces, so that they can be used as oil-free lubricants in the working of steel sheets.

JP8010703 A2 discloses polysiloxanes from the hydrolysis and condensation of organic chlorosilanes as primers for corrosion protection constituents and as corrosion protection resins.

DE 3920297 A1 describes heteropolycondensates of siloxy-aluminate esters with organosilanes bearing hydrolyzable radicals, optionally with addition of organofunctional silanes with silicic esters, as corrosion protection. The corrosion protection is in this case brought about by dipping into a silanization bath and subsequent drying. Drying is carried out at at least 50° C.

SUMMARY OF THE INVENTION

It is an object of the present invention to achieve homogeneous passivation from the vapor/gas phase without dipping or spraying and without after-treatment. In addition, passivation should occur at a surface temperature of 50° C. or less. These and other objects are achieved by the invention, which passivates by the use of a group of functional silanes which can react with active steel surfaces even at relatively low temperatures.

DETAILED DESCRIPTION OF THE PREFERRED EMBODIMENTS

The invention provides for the use of compounds of the general formula $$R_n Z_p SiX_{(4-n-p)}$$

for the treatment of steel surfaces;

where X is selected from the group consisting of H, OH, halogen, alkoxy (C1-C3), acyloxy (C1-C3) and $NR^1R^2$, where $R^1$ and $R^2$ are each selected from the group consisting of H, methyl and ethyl;

where R is selected from the group consisting of straight-chain and/or branched alkyl radicals C1-C6, straight-chain and/or branched alkenyl radicals C1-C6 or aryl radicals C1-C6, optionally interrupted by O, S;

where Z is an organofunctional group which is bound via an (optionally branched and/or unsaturated) C1-C6-alkylene radical and is selected from the group consisting of halogen, optionally substituted amino group, amide, aldehyde, alkylcarbonyl, carboxy, hydroxy, mercapto, cyano, alkoxy, alkoxycarbonyl, sulfonic acid, phosphonic acid, phosphate, acryloxy, methacryloxy, glycidyloxy, epoxy and vinyl groups;

where n=0, 1 or 2 and p=1, 2 or 3 and 3≥(n+p)≥1;

where the compound of the general formula (1) contains not more than 20 carbon atoms.

The invention provides a corrosion-inhibiting surface treatment of phosphorus-containing steel surfaces, which can be carried out more simply and under milder conditions than is known from the prior art; in particular, the treatment can be carried out on installed steel objects having undercuts (pipes, containers, apparatuses, etc.) in the case of which a dipping or spray process could be carried out only with great difficulty.

In addition, significantly smaller amounts are required for the surface treatment than in the case of, for example, dipping or flooding processes, which improves the economics and reduces environmental pollution.

Here, the steel surface to be treated is brought into contact at a surface temperature of less than 50° C. with vapor of the compounds of the general formula 1 or mixtures thereof.

A solvent which is inert under the use conditions, for example, one selected from among alcohols (methanol, ethanol, isopropanol), ethers (dimethyl ether, diethyl ether, diisopropyl ether, dioxane, tetrahydrofuran), ketones (acetone, methyl ethyl ketone [MEK]), linear or branched alkanes (n-butane, n-pentane, n-hexane, n-heptane) and alkane mixtures (petroleum ether having a boiling range from 40 to 60° C.), halogenated alkanes (chloromethane, dichloromethane, trichloromethane, tetrachloromethane, chloroethane), aromatics (benzene, toluene, o-xylene, pyridine), optionally substituted aromatics such as methoxybenzene, chlorobenzene or hexamethyldisiloxane) is preferably present.

Preference is given to using a solvent having a boiling point at the pressure of the surrounding atmosphere of less than 150° C., more preferably less than 100° C., and most preferably less than 70° C.

Examples of X in the compounds of the general formula (1) include fluorine, chlorine, bromine, methoxy, ethoxy, acetoxy, 2-chloroethoxy, and 2-methoxyethoxy.

Particular preference is given to chlorine, methoxy, ethoxy, acetoxy groups and especial preference is given to the methoxy group.

Examples of R in the compounds of the general formula (1) include
methyl, ethyl, and phenyl groups.

Particular preference is given to methyl and ethyl groups, most preferably the methyl group.

Examples of Z in the compounds of the general formula (1) include
dichloromethyl, chloromethyl, 2-chloroethyl, 3-chloropropyl, aminomethyl, 3-aminopropyl, 3-N-(2-aminoethyl)aminopropyl, N-(2-aminoethyl)aminomethyl, N,N-dimethylaminomethyl, N,N-diethylaminomethyl, N-butylaminomethyl, 3-thiopropyl, cyanoethyl, N-((trimethoxysilyl)methyl)aminomethyl, N-phenylaminomethyl, N-cyclohexylaminomethyl, hydroxymethyl, methoxymethyl, ethoxymethyl, 3-glycidoxypropyl, 3-acryloxypropyl, and methacryloxymethyl.

Preferred are 3-aminopropyl, N-(2-aminoethyl)aminomethyl, and N,N-diethylaminomethyl, and Particularly preferred are N-(2-aminoethyl)aminomethyl, N,N-diethylaminomethyl Examples of compounds of the general formula (1) include
(MeO)$_3$Si—CH$_2$—C$_1$, (MeO)$_2$MeSi—CH$_2$—C$_1$, (MeO)$_3$Si—(CH$_2$)$_3$—C$_1$, (MeO)$_3$Si—CHCl$_2$, Me(MeO)$_2$Si—(CH$_2$)$_2$—CF$_3$Cl$_3$Si—CH$_2$—C$_1$, Cl$_2$MeSi—CH$_2$—C$_1$, F$_3$Si—(CH$_2$)$_3$—C$_1$, (MeO)$_3$Si—CH$_2$—OMe, (MeO)$_2$MeSi—CH$_2$—OMe, (MeO)$_3$Si—(CH$_2$)$_3$—OMe, (MeO)$_3$Si—CH$_2$—NH$_2$, (MeO)$_2$MeSi—CH$_2$—NH-Et, (MeO)$_3$Si—(CH$_2$)$_3$—NH$_2$, (EtO)$_3$Si—CH$_2$—NHBu, (EtO)$_2$MeSi—CH$_2$—NH-Et, (MeO)$_3$Si—(CH$_2$)$_3$—NH$_2$, (MeO)$_3$Si—CH$_2$—NH—CH$_2$CH$_2$—NH$_2$, (MeO)$_2$MeSi—CH$_2$—N(Et)$_2$, (MeO)$_3$Si—(CH$_2$)$_3$—NH—CH$_2$CH$_2$—NH$_2$, (MeO)$_3$Si—(CH$_2$)$_3$—SH, Me(AcO)$_2$-Si—CH$_2$—C$_1$, (MeO)$_3$Si—(CH$_2$)$_2$—CN, Me(MeO)$_2$Si—CH$_2$-NHPh, (MeO)$_3$Si—CH$_2$—NHPh, (C$_1$—CH$_2$CH$_2$—O)$_2$MeSi—CH$_2$Cl, (EtO)$_3$Si—CH$_2$—N(Bu)$_2$ and also the cyclic compounds formed by intramolecular condensation (optionally in admixture with the open-chain silanes)

and also the dimers and oligomers formed by intermolecular condensation (optionally in admixture with the open-chain silanes and/or abovementioned cyclic compounds):

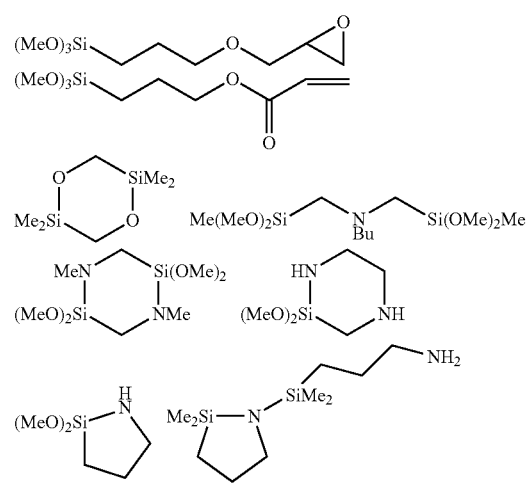

Preference is given to using amino-functional alkoxysilanes.

Very particular preference is given to using alpha-aminofunctional alkoxysilanes.

To ensure a very high volatility, monomers of the compounds of the general formula 1 are preferably used.

The compounds of the general formula 1 preferably contain not more than 12 carbon atoms, more preferably not more than 9 carbon atoms.

Procedure for surface treatment: the vapor required for the treatment is, for example, produced either by vaporizing the silane (or mixture, optionally in the presence of a solvent) by heating in an apparatus (vaporizer) or by passing an optionally heated gas (N2, He, Ar, air) through the liquid, optionally heated silane (or mixture, optionally in the presence of a solvent) (saturator) and conveyed onto the surface to be treated.

This is achieved either via pipes or apparatuses connected directly to the apparatus or within the apparatus, or the object to be treated is placed in a chamber which is supplied with the vapor.

To avoid condensation of the vapor and thus an accumulation in the vicinity of the entry point, it can, particularly in the case of the treatment of interior spaces of apparatuses having a large length/diameter ratio, be useful to heat the surfaces before and during the treatment process.

Aerosols can also be used and the same applies to these. They can easily be produced by means of, for example, ultrasound emitters and conveyed by means of a gas stream onto the surface.

Treatment with mixtures of aerosol and vapor is also conceivable.

The treatment time depends on the vaporizable amount of silane and the size of the surface to be treated.

The treatment process can easily be monitored by detection of the vapor/aerosol/gas stream exiting from the apparatus. For example, acidic and basic silanes can be detected by means of moist indicator paper. Excess silane can simply be condensed out by means of a condenser at the outlet opening and thus be recovered. This procedure allows a recycle mode of operation in which the amount of the silane applied to the surface can be determined by simple backweighing and in addition ensures that environmental pollution is kept very low. However, excess silane can also be collected by means of scrubbers or adsorbers.

According to experience, siloxane coatings are thermally stable up to about 300° C., see, for example, W. Noll: Chemie und Technologie der Silicone, Verlag Chemie, Weinheim 1960, page 151.

Corrosion can therefore be slowed even at 200° C.

The invention thus makes possible at least temporarily passivating coating of corrosion-sensitive steel surfaces by means of a surface treatment at temperatures of less than 50° C. against the corrosive atmosphere of a gas mixture of residual moisture, chlorine, hydrogen chloride, chlorosilanes, hydrogen and optionally reactive elemental silicon.

The passivation reduces the phosphorus extraction rate, i.e. also reduces the phosphorus content of the polycrystalline silicon deposited in the steel plant, so that start-up of such plants can be accelerated without endangering quality. Particularly in closed systems for deposition of polysilicon by means of chlorosilanes which in combination with moisture bring about corrosion effects on steel surfaces, the use displays great advantages, e.g. in the hydrogen recycle gas or in chlorosilane condensation systems.

EXAMPLES

A comprehensive trial using different silanes and derivatives thereof was carried out.

Coated and uncoated steel specimens were subsequently exposed to a corrosive atmosphere composed of moist hydrogen chloride (hydrochloric acid).

The steel samples were cleaned with deionized water and dried using acetone before treatment with the respective compound. Between the individual treatment steps, the steel specimens were stored in an inert atmosphere in a desiccator to protect them against environment influences, in particular atmospheric moisture. The steel specimens were weighed before commencement of the first treatment step, and likewise after each of the individual treatment steps. Finally, the weight loss caused by corrosion was determined on the test specimens. The documentation of the state of the test specimens as a function of the experimental conditions selected (silane, material, treatment time, etc.) was carried out by means of photos, by optical microscopy and by SEM.

The individual treatment steps after cleaning and documentation of the initial state have been carried out are described below.

The test specimens were placed in a desiccator and stored over the respective silane at an ambient temperature of 40° C.

The steel specimens which had been pretreated with silane and also in each case a comparative specimen were stored over concentrated hydrochloric acid for a) 48 hours or b) 4 hours, in each case at 40° C. This treatment step makes it possible to simulate corrosive conditions as prevail in the case of the steel bodies described at the outset.

After each treatment step, the specimens were examined by electron-microscopic methods and analyzed and assessed by optical-microscopic methods and by EDX (energy dispersive X-ray).

Various corrosive attacks were assessed on the ground surfaces of the specimens as a function of the silane used and the treatment time.

Differently pretreated steel specimens of two types of material were used: austenitic chromium-nickel stainless steel and carbon steel alloys.

The specimens were pretreated: either only pickled, or pickled and surface-ground.

For pickling the materials, the following pickling solutions were used:

20 parts by volume of hydrochloric acid (1.18 g/cm$^3$=37% by mass), 3 parts by volume of nitric acid (1.39 g/cm$^3$=65% by mass), 77 parts by volume of water.

The bath temperature did not exceed 50° C. The removal of material was ≤3 µm.

After pickling, the parts were rinsed with tap water (chlorine ion content ≤50 ppm) until acid could no longer be found on the pickled parts. Neutrality was confirmed by means of indicator paper.

Conventional grinding disks or rotor blade grinders were utilized for surface-grinding.

The grain size to be selected was adapted stepwise and in a suitable form to the grain size of the final ground surface and the cleaning effect.

The surface treatment was carried out with an average peak-to-valley height of Rz≤4 µm. This peak-to-valley height can generally be achieved by grinding using a grain size of 240 or finer.

In the case of the reference specimens, no treatment with a silane or with a cyclic aza compound was carried out.

For the other specimens, the following silanes were used:

Diethylaminomethyltrimethoxysilane, H-triethoxysilane, TM 10/47-2 (reaction product of Si(OEt)$_4$ and SiCl$_4$ (by GC: 52% of ClSi(OEt)$_3$, 12% of Cl$_2$Si(OEt)$_2$), 35% of Cl$_3$Si(OEt)), N,N-diethylaminomethyl)dimethoxymethylsilane (97.8 GC-%) and (2-aminoethyl)aminomethyltrimethoxysilane (93.3 GC-%) and the corresponding cyclic aza compound (4.5 GC-%)–GC=Gas Chromatograph.

TABLE 1

Table 1 shows the structures of the silanes examined.

| Compound | Structure |
|---|---|
| Diethylaminomethyltrimethoxysilane | Et$_2$N—CH$_2$—Si(OMe)$_3$ |
| H-Triethoxysilane | HSi(OEt)$_3$ |
| TM 10/47-2 | Reaction product of Si(OEt)$_4$ and SiCl$_4$ (according to GC: 52% ClSi(OEt)$_3$, 12% Cl$_2$Si(OEt)$_2$, 35% Cl$_3$Si(OEt) |
| (N,N-Diethylaminomethyl)dimethoxymethylsilane (97.8 GC-%) | [structure: piperazine-like ring with N—CH$_2$—Si(OCH$_3$)$_2$CH$_3$] |
| (2-Aminoethyl)aminomethyltrimethoxysilane 93.3 GC-%) and the corresponding cyclic aza compound (4.5 GC-%) | H$_2$N—CH$_2$CH$_2$—NH—CH$_2$—Si(OMe)$_3$; HN⟨ring⟩NH—Si(OMe)$_2$ |

The structures were in each case confirmed by means of $^1$H- and $^{29}$Si-NMR.

As comparative specimen, the steel specimen made of the appropriate material which had been pretreated but not conditioned with a silane was used in each case.

The steel specimens were cleaned with deionized (DI) water, rinsed with acetone and dried before the treatment with the appropriate compound.

Between the individual treatment steps, the steel specimens were stored in an inert, e.g. nitrogen, atmosphere in a desiccator for protection against environmental influences, in particular atmospheric moisture.

The steel specimens were weighed before commencement of the first treatment step and likewise after each of the individual treatment steps.

Finally, the weight loss caused by corrosion was determined on the test specimens.

The documentation of the state of the test specimens as a function of the selected experimental conditions (silane, material, treatment time, etc.) was carried out by means of photos, by optical microscopy and by means of SEM.

The individual treatment steps after cleaning and documentation of the initial state had been carried out are described below.

The test specimens were placed in a drier (desiccator) and stored over the appropriate silane at an ambient temperature of 40° C. for 48 hours.

The steel specimens which had been pretreated with silane and also in each case a comparative specimen were stored over hydrochloric acid (36% by mass) for a) 48 hours or b) 4 hours, in each case at 40° C.

Corrosive conditions as prevail in the pipes described at the outset can be simulated by this treatment step.

Tables 2 and 3 show the results.

TABLE 2

Treatment at 40° C. for 24 h.

| No. | Pre-treatment Material A, B | Treatment with silane | | | | | | Treatment with HCl | | Result | | |
|---|---|---|---|---|---|---|---|---|---|---|---|---|
| | | U | S1 | S2 | S3 | S4 | S5 | 40° C. 24 h | 40° C. 4 h | G | O | B |
| 1 | M1 A | x | | | | | | x | | 2.3 | | 3 |
| 2 | M1 A + B | x | | | | | | x | | 2.0 | | 3 |
| 5 | M2 A | x | | | | | | x | | 1.2 | | 3 |
| 6 | M2 A + B | x | | | | | | x | | 1.7 | | 3 |
| 9 | M1 A | | x | | | | | x | | 1.3 | | 3 |
| 10 | M1 A | | | x | | | | x | | 2.4 | | 3 |
| 11 | M1 A | | | | x | | | x | | 1.7 | | 3 |
| 14 | M1 A + B | | x | | | | | x | | 2.1 | | 3 |
| 15 | M1 A + B | | | x | | | | x | | 3.6 | | 3 |
| 16 | M1 A + B | | | | x | | | x | | 3.8 | | 3 |
| 19 | M2 A | | x | | | | | x | | 1.8 | | 3 |
| 20 | M2 A | | | x | | | | x | | 1.9 | | 3 |
| 21 | M2 A | | | | x | | | x | | 2.8 | | 3 |
| 24 | M2 A + B | | x | | | | | x | | 1.7 | | 3 |
| 25 | M2 A + B | | | x | | | | x | | 1.8 | | 3 |
| 26 | M2 A + B | | | | x | | | x | | 2.8 | | 3 |

TABLE 3

Treatment at 40° C. for 4 h.

| No. | Pre-treatment Material A, B | Treatment with silane | | | | | | Treatment with HCl | | Result | | |
|---|---|---|---|---|---|---|---|---|---|---|---|---|
| | | U | S1 | S2 | S3 | S4 | S5 | 40° C. 24 h | 40° C. 4 h | G | O | B |
| 3 | M1 A | x | | | | | | | x | 3.0 | x | 2 |
| 4 | M1 A + B | x | | | | | | | x | 4.4 | x | 3 |
| 7 | M2 A | x | | | | | | | x | 3.7 | x | 2 |
| 8 | M2 A + B | x | | | | | | | x | 4.9 | x | 3 |
| 12 | M1 A | | | | | x | | | x | 2.8 | x | 1 |
| 13 | M1 A | | | | | | x | | x | 2.9 | x | 1 |
| 17 | M1 A + B | | | | | x | | | x | 2.6 | x | 1 |
| 18 | M1 A + B | | | | | | x | | x | 3.4 | x | 1 |
| 22 | M2 A | | | | | x | | | x | 2.8 | x | 1 |
| 23 | M2 A | | | | | | x | | x | 2.6 | x | 1 |
| 27 | M2 A + B | | | | | x | | | x | 2.9 | x | 1 |
| 28 | M2 A + B | | | | | | x | | x | 2.7 | x | 1 |

Legend for Tables 2 and 3

Materials
M1 Chromium-nickel stainless steel
M2 Carbon steel

Pretreatment
A Pickled
B Surface-ground

Treatment with Silane
U Untreated reference specimens
S1 Diethylaminomethyltrimethoxysilane
S2 H-Triethoxysilane
S3 TM 10/47-2
S4 N,N-(Diethylaminomethyl)dimethoxymethylsilane (97.8 GC-%)
S5 (2-Aminoethyl)aminomethyltrimethoxysilane (93.3 GC-%) and the corresponding cyclic aza compound (4.5 GC-%)

Results
G Weight loss [mg/h] after treatment with HCl
O Optical examination [optical microscopy, SEM (energy dispersive X-ray)]

Example of optical examination: enlargement stages 3.2× (optical microscope, reflected light, coaxial illumination) to 500× and EDX analysis.

Above a magnification of 50×, a scanning electron microscope was used.

B Evaluation
1 Slight corrosion=undetectable grinding tracks
2 Corrosion=detectable grinding tracks
3 Severe corrosion Evaluation was carried out in respect of pickled-away, undetectable grinding tracks, detectable scratches, holes, etc. Qualitative assessment was carried out by means of SEM. Quantitative evaluation was carried out via the weight loss.

The results show that after a process according to the invention, the steel support bodies treated with silane and cyclic aza compound vapors at 40° C. display significantly better corrosion resistance than do untreated support bodies.

In addition, it was able to be shown that uniform application of the silane protective layer is ensured.

Notably, corrosion could be significantly reduced compared to the untreated specimens under the conditions according to the process.

This is reflected not only in the reduced weight decrease (gravimetric determination) but also in the optical examination of the treated test specimens which had been exposed to corrosive conditions.

Typical surface-ground structures which are largely retained even after the corrosive treatment step in the specimens treated with (2-aminoethyl)aminomethyltrimethoxysilane (93.3 GC-%) and the corresponding cyclic aza compound (4.5 GC-%) support and reinforce the gravimetric findings.

Comparative Example

A freshly installed pipe made of carbon steel and having a length of 87 m and a diameter of 250 mm was used without surface treatment after flushing with nitrogen at 10,000 m³/h for one day.

This steel pipe was supplied with 9980 standard m³/h of hydrogen and operated in the gas recycle mode.

The foreign gas components were found to be HCl at 0.8% by volume and moisture at 0.14 ppmv.

Of this hydrogen stream, 1930 standard m³/h were passed into or through a running Siemens reactor for deposition of polysilicon from trichlorosilane.

A phosphorus content of 400 ppta was measured in the first polysilicon rods deposited.

The phosphorus contamination of the polysilicon rods was able to reach the specified value of less than 40 ppta only after 30 days, after the eighth batch.

Example

A freshly installed steel pipe made of carbon steel and having a length of 89 m and a diameter of 250 mm was flushed with 10,000 standard m³/h of nitrogen saturated with (2-aminoethyl)aminomethyltrimethoxysilane (93.3 GC-%) for 24 hours at 25-28° C.

After this treatment, the pipe was supplied with 10,000 standard m³/h of hydrogen and operated in the gas recycle mode.

The foreign gas components were found to be HCl at 0.9% by volume and moisture at 0.14 ppmv.

Of this hydrogen stream, 1940 standard m³/h were passed into or through a running Siemens reactor for deposition of polysilicon from trichlorosilane.

A phosphorus content of 100 ppta was measured in the first polysilicon rods deposited and even the second batch achieved the specified value of 40 ppta.

The invention claimed is:

1. A treated, phosphorus-containing steel surface, prepared by exposing the phosphorus-containing steel surface directly to an α-amino-functional alkoxysilane in a gas phase, wherein the treated, phosphorus-containing steel surface is resistant to corrosion by a gas mixture containing chlorine, hydrogen chloride, chlorosilanes, hydrogen, moisture, and optionally reactive elemental silicon.

2. The treated, phosphorus-containing steel surface of claim 1, wherein at least one α-amino-functional alkoxysilane is selected from the group consisting of N,N-(diethylaminomethyl)dimethoxymethylsilane, and a mixture of (2-aminoethyl)aminomethyltrimethoxysilane and cyclic aza compounds derived therefrom.

3. A process for treating a phosphorus-containing steel surface, comprising exposing the steel surface directly to a vapor of alpha-amino-functional alkoxysilane, wherein the temperature of the steel surface is less than 50° C., and the vapor-treated steel surface is subsequently exposed to a corrosive atmosphere of a gas mixture of residual moisture, chlorine, hydrogen chloride, chlorosilanes, hydrogen and optionally reactive elemental silicon.

4. The process of claim 3, wherein the alkoxysilanes are N,N-(dietxhylaminomethyl)-dimethoxymethylsilane or a mixture of (2-aminoethyl)aminomethyltrimethoxysilane and a cyclic aza compound derived therefrom.

5. The process of claim 3, wherein an aerosol is conveyed onto the steel surface during the treatment.

6. In a process for the preparation of polycrystalline silicon by chemical vapor deposition from a chlorosilane and hydrogen at elevated temperature in a reactor, wherein unreacted hydrogen is recovered and recycled to the reactor, the recycled hydrogen containing HCl and residual moisture, wherein the recycled hydrogen contacts a phosphorus-containing steel surface, the improvement comprising reducing the phosphorus content of the polycrystalline silicon by treating a phosphorus-containing steel surface by the process of claim 3.

* * * * *